United States Patent
Coffey et al.

(10) Patent No.: US 9,470,742 B2
(45) Date of Patent: Oct. 18, 2016

(54) MANAGED FIBER CONNECTIVITY SYSTEMS

(71) Applicant: ADC Telecommunications, Inc., Berwyn, PA (US)

(72) Inventors: Joseph C. Coffey, Burnsville, MN (US); Kamlesh G. Patel, Chanhassen, MN (US)

(73) Assignee: CommScope Technologies LLC, Hickory, NC (US)

( * ) Notice: Subject to any disclaimer, the term of this patent is extended or adjusted under 35 U.S.C. 154(b) by 20 days.

(21) Appl. No.: 13/958,205

(22) Filed: Aug. 2, 2013

(65) Prior Publication Data

US 2014/0038462 A1    Feb. 6, 2014

Related U.S. Application Data

(60) Provisional application No. 61/679,485, filed on Aug. 3, 2012.

(51) Int. Cl.
*G02B 6/38* (2006.01)
*G01R 31/08* (2006.01)
(Continued)

(52) U.S. Cl.
CPC .............. *G01R 31/08* (2013.01); *G01R 31/026* (2013.01); *G02B 6/3807* (2013.01); *G02B 6/3817* (2013.01); *G02B 6/3825* (2013.01); *H04L 43/0811* (2013.01); *G02B 6/3895* (2013.01)

(58) Field of Classification Search
CPC  G02B 6/3825; G02B 6/3887; G02B 6/3821; G02B 6/3885; G02B 6/3893

USPC .................... 385/53, 55, 56, 58, 60, 70, 71
See application file for complete search history.

(56) References Cited

U.S. PATENT DOCUMENTS

| 3,243,761 A | 3/1966 | Piorunneck |
| RE26,692 E | 10/1969 | Ruehlemann |

(Continued)

FOREIGN PATENT DOCUMENTS

| CA | 2499803 | 4/2004 |
| DE | 102 44 304 | 3/2004 |

(Continued)

OTHER PUBLICATIONS

International Search Report and Written Opinion for PCT/US2013/053441 mailed Dec. 16, 2013.

(Continued)

*Primary Examiner* — Jennifer Doan
(74) *Attorney, Agent, or Firm* — Merchant & Gould P.C.

(57) ABSTRACT

A connectorized media cable includes at least one primary media segment; a first plug connector coupled to a first end of the media segment; and a second plug connector coupled to the second end of the media segment. Each plug connector includes a storage device having memory configured to store physical layer information pertaining to the cable. The storage device also includes at least four contacts that are electrically connected to the memory and isolated from the primary media segment. Certain types of cables include an electrical conductor extending along the media cable between a fourth one of the contacts of the first plug connector and a fourth one of the contacts of the second plug connector. The plug connectors of other types of cables have two data contacts coupled to the memory.

18 Claims, 9 Drawing Sheets

(51) Int. Cl.
*G01R 31/02* (2006.01)
*H04L 12/26* (2006.01)

(56) References Cited

U.S. PATENT DOCUMENTS

| | | | |
|---|---|---|---|
| 3,954,320 A | 5/1976 | Hardesty |
| 4,127,317 A | 11/1978 | Tyree |
| 4,737,120 A | 4/1988 | Grabbe et al. |
| 4,953,194 A | 8/1990 | Hansen et al. |
| 4,968,929 A | 11/1990 | Hauck et al. |
| 5,041,005 A | 8/1991 | McHugh |
| 5,052,940 A | 10/1991 | Bengal |
| 5,064,381 A | 11/1991 | Lin |
| 5,107,532 A | 4/1992 | Hansen et al. |
| 5,161,988 A | 11/1992 | Krupka |
| 5,166,970 A | 11/1992 | Ward |
| 5,199,895 A | 4/1993 | Chang |
| 5,222,164 A | 6/1993 | Bass, Sr. et al. |
| 5,265,187 A | 11/1993 | Morin et al. |
| 5,305,405 A | 4/1994 | Emmons et al. |
| 5,353,367 A | 10/1994 | Czosnowski et al. |
| 5,393,249 A | 2/1995 | Morgenstern et al. |
| 5,394,503 A | 2/1995 | Dietz, Jr. et al. |
| 5,413,494 A | 5/1995 | Dewey et al. |
| 5,418,334 A | 5/1995 | Williams |
| 5,419,717 A | 5/1995 | Abendschein et al. |
| 5,448,675 A | 9/1995 | Leone et al. |
| 5,467,062 A | 11/1995 | Burroughs |
| 5,470,251 A | 11/1995 | Sano |
| 5,473,715 A | 12/1995 | Schofield et al. |
| 5,483,467 A | 1/1996 | Krupka et al. |
| 5,579,425 A | 11/1996 | Lampert et al. |
| 5,674,085 A | 10/1997 | Davis et al. |
| 5,685,741 A | 11/1997 | Dewey et al. |
| 5,712,942 A | 1/1998 | Jennings et al. |
| 5,800,192 A | 9/1998 | David et al. |
| 5,821,510 A | 10/1998 | Cahen et al. |
| 5,854,824 A | 12/1998 | Bengal et al. |
| 5,871,368 A | 2/1999 | Erdner et al. |
| 5,910,776 A | 6/1999 | Black |
| 6,002,331 A | 12/1999 | Laor |
| 6,095,837 A | 8/2000 | David et al. |
| 6,095,851 A | 8/2000 | Laity et al. |
| 6,116,961 A | 9/2000 | Henneberger et al. |
| 6,222,908 B1 | 4/2001 | Bartolutti et al. |
| 6,222,975 B1 | 4/2001 | Gilbert et al. |
| 6,227,911 B1 | 5/2001 | Boutros et al. |
| 6,234,830 B1 | 5/2001 | Ensz et al. |
| 6,238,235 B1 | 5/2001 | Shavit et al. |
| 6,280,231 B1 | 8/2001 | Nicholls |
| 6,285,293 B1 | 9/2001 | German et al. |
| 6,300,877 B1 | 10/2001 | Schannach et al. |
| 6,330,148 B1 | 12/2001 | Won et al. |
| 6,330,307 B1 | 12/2001 | Bloch et al. |
| 6,350,148 B1 | 2/2002 | Bartolutti et al. |
| 6,364,694 B1 | 4/2002 | Lien |
| 6,409,392 B1 | 6/2002 | Lampert et al. |
| 6,421,322 B1 | 7/2002 | Koziy et al. |
| 6,422,895 B1 | 7/2002 | Lien |
| 6,424,710 B1 | 7/2002 | Bartolutti et al. |
| 6,437,894 B1 | 8/2002 | Gilbert et al. |
| 6,456,768 B1 | 9/2002 | Boncek et al. |
| D466,479 S | 12/2002 | Pein et al. |
| 6,499,861 B1 | 12/2002 | German et al. |
| 6,511,231 B2 | 1/2003 | Lampert et al. |
| 6,522,737 B1 | 2/2003 | Bartolutti et al. |
| 6,554,484 B2 | 4/2003 | Lampert |
| 6,574,586 B1 | 6/2003 | David et al. |
| 6,612,856 B1 | 9/2003 | McCormack |
| 6,626,697 B1 | 9/2003 | Martin et al. |
| 6,636,152 B2 | 10/2003 | Schannach et al. |
| 6,684,179 B1 | 1/2004 | David |
| 6,725,177 B2 | 4/2004 | David et al. |
| 6,743,044 B2 | 6/2004 | Musolf et al. |
| 6,793,408 B2 | 9/2004 | Levy et al. |
| 6,802,735 B2 | 10/2004 | Pepe et al. |
| 6,808,116 B1 | 10/2004 | Eslambolchi et al. |
| 6,811,446 B1 | 11/2004 | Chang |
| 6,814,624 B2 | 11/2004 | Clark et al. |
| 6,850,685 B2 | 2/2005 | Tinucci et al. |
| 6,898,368 B2 | 5/2005 | Colombo et al. |
| 6,905,363 B2 | 6/2005 | Musolf et al. |
| 6,932,517 B2 | 8/2005 | Swayze et al. |
| D510,068 S | 9/2005 | Haggay et al. |
| 6,939,168 B2 | 9/2005 | Oleynick et al. |
| 6,961,675 B2 | 11/2005 | David |
| 6,971,895 B2 | 12/2005 | Sago et al. |
| 6,976,867 B2 | 12/2005 | Navarro et al. |
| 7,077,710 B2 | 7/2006 | Haggay et al. |
| 7,081,808 B2 | 7/2006 | Colombo et al. |
| 7,088,880 B1 | 8/2006 | Gershman |
| 7,112,090 B2 | 9/2006 | Caveney et al. |
| 7,123,810 B2 | 10/2006 | Parrish |
| 7,153,142 B2 | 12/2006 | Shifris et al. |
| 7,165,728 B2 | 1/2007 | Durrant et al. |
| 7,193,422 B2 | 3/2007 | Velleca et al. |
| 7,207,819 B2 * | 4/2007 | Chen ............................. 439/188 |
| 7,210,858 B2 | 5/2007 | Sago et al |
| 7,226,217 B1 | 6/2007 | Benton et al. |
| 7,234,944 B2 | 6/2007 | Nordin et al. |
| 7,241,157 B2 | 7/2007 | Zhuang et al. |
| 7,297,018 B2 | 11/2007 | Caveney et al. |
| 7,300,214 B2 | 11/2007 | Doo et al. |
| 7,312,715 B2 | 12/2007 | Shalts et al. |
| D559,186 S | 1/2008 | Kelmer |
| 7,315,224 B2 | 1/2008 | Gurovich et al. |
| 7,352,289 B1 | 4/2008 | Harris |
| 7,356,208 B2 | 4/2008 | Becker |
| 7,370,106 B2 | 5/2008 | Caveney |
| 7,384,300 B1 | 6/2008 | Salgado et al. |
| 7,396,245 B2 | 7/2008 | Huang et al. |
| 7,458,517 B2 | 12/2008 | Durrant et al. |
| 7,479,032 B2 | 1/2009 | Hoath et al. |
| 7,490,996 B2 | 2/2009 | Sommer |
| 7,497,709 B1 | 3/2009 | Zhang |
| 7,519,000 B2 | 4/2009 | Caveney et al. |
| 7,534,137 B2 | 5/2009 | Caveney et al. |
| 7,552,872 B2 | 6/2009 | Tokita et al. |
| 7,563,116 B2 | 7/2009 | Wang |
| 7,570,861 B2 | 8/2009 | Smrha et al. |
| 7,575,454 B1 | 8/2009 | Aoki et al. |
| 7,588,470 B2 | 9/2009 | Li et al. |
| 7,591,667 B2 | 9/2009 | Gatnau Navarro et al. |
| 7,607,926 B2 | 10/2009 | Wang |
| 7,635,280 B1 | 12/2009 | Crumlin et al. |
| 7,648,377 B2 | 1/2010 | Naito et al. |
| 7,682,174 B2 | 3/2010 | Chen |
| 7,722,370 B2 | 5/2010 | Chin |
| 7,727,026 B2 | 6/2010 | Qin et al. |
| 7,785,154 B2 | 8/2010 | Peng |
| 7,798,832 B2 | 9/2010 | Qin et al. |
| 7,811,119 B2 | 10/2010 | Caveney et al. |
| 7,814,240 B2 | 10/2010 | Salgado et al. |
| 7,867,017 B1 | 1/2011 | Chen |
| 7,869,426 B2 | 1/2011 | Hough et al. |
| 7,872,738 B2 | 1/2011 | Abbott |
| 7,880,475 B2 | 2/2011 | Crumlin et al. |
| 8,157,582 B2 | 4/2012 | Frey et al. |
| 8,282,425 B2 | 10/2012 | Bopp et al. |
| 8,287,316 B2 | 10/2012 | Pepe et al. |
| 2002/0008613 A1 | 1/2002 | Nathan et al. |
| 2002/0081076 A1 | 6/2002 | Lampert et al. |
| 2003/0031423 A1 | 2/2003 | Zimmel |
| 2004/0052471 A1 | 3/2004 | Colombo et al. |
| 2004/0052498 A1 | 3/2004 | Colombo et al. |
| 2004/0117515 A1 | 6/2004 | Sago et al. |
| 2004/0240807 A1 | 12/2004 | Frohlich et al. |
| 2005/0249477 A1 | 11/2005 | Parrish |
| 2006/0160395 A1 | 7/2006 | Macauley et al. |
| 2006/0193591 A1 | 8/2006 | Rapp et al. |
| 2006/0228086 A1 | 10/2006 | Holmberg et al. |
| 2007/0116411 A1 | 5/2007 | Benton et al. |
| 2007/0237470 A1 | 10/2007 | Aronson et al. |
| 2007/0254529 A1 | 11/2007 | Pepe et al. |

(56) References Cited

U.S. PATENT DOCUMENTS

| | | |
|---|---|---|
| 2008/0090450 A1 | 4/2008 | Harano et al. |
| 2008/0090454 A1 | 4/2008 | Hoath et al. |
| 2008/0100456 A1 | 5/2008 | Downie et al. |
| 2008/0100467 A1 | 5/2008 | Downie et al. |
| 2008/0175532 A1 | 7/2008 | Ruckstuhl et al. |
| 2008/0175550 A1 | 7/2008 | Coburn et al. |
| 2009/0034911 A1 | 2/2009 | Murano |
| 2009/0097846 A1 | 4/2009 | Kozischek et al. |
| 2009/0166404 A1 | 7/2009 | German et al. |
| 2009/0215310 A1 | 8/2009 | Hoath et al. |
| 2009/0232455 A1 | 9/2009 | Nhep |
| 2010/0048064 A1 | 2/2010 | Peng |
| 2010/0211664 A1 | 8/2010 | Raza et al. |
| 2010/0211665 A1 | 8/2010 | Raza et al. |
| 2010/0211697 A1 | 8/2010 | Raza et al. |
| 2010/0215049 A1 | 8/2010 | Raza |
| 2010/0303421 A1 | 12/2010 | He et al. |
| 2011/0043371 A1 | 2/2011 | German et al. |
| 2011/0115494 A1 | 5/2011 | Taylor et al. |
| 2011/0222819 A1 | 9/2011 | Anderson et al. |
| 2011/0235979 A1 | 9/2011 | Anderson et al. |
| 2011/0255829 A1 | 10/2011 | Anderson et al. |
| 2011/0262077 A1 | 10/2011 | Anderson et al. |
| 2012/0003877 A1 | 1/2012 | Bareel et al. |
| 2012/0021636 A1 | 1/2012 | Debendictis et al. |
| 2012/0208401 A1 | 8/2012 | Petersen |
| 2014/0219656 A1* | 8/2014 | Lawson et al. .............. 398/49 |

FOREIGN PATENT DOCUMENTS

| | | |
|---|---|---|
| DE | 10 2004 033 940 A1 | 2/2006 |
| EP | 1 199 586 A2 | 4/2002 |
| EP | 1 237 024 A1 | 9/2002 |
| EP | 1 467 232 A1 | 10/2004 |
| EP | 1 662 287 A1 | 5/2006 |
| WO | WO 00/65696 | 11/2000 |
| WO | WO 02/47215 A1 | 6/2002 |
| WO | WO 2007/061490 A2 | 5/2007 |
| WO | WO 2010/001400 | 1/2010 |
| WO | WO 2010/081186 A1 | 7/2010 |
| WO | WO 2010/121639 A1 | 10/2010 |

OTHER PUBLICATIONS

*Avaya's Enhanced SYSTIMAX® iPatch System Enables IT Managers to Optimise Network Efficiency and Cut Downtime*, Press Release, May 20, 2003, obtained from http://www.avaya.com/usa/about-avaya/newsroom/news-releases/2003/pr-030520 on Jan. 7, 2009.

*Avaya's Enhanced SYSTIMAX® iPatch System Enables IT Managers to Optimise Network Efficiency and Cut Downtime*, Press Release, May 9, 2003, obtained from http://www.avaya.com/usa/about-avaya/newsroom/news-releases/2003/pr-030509 on Jan. 7, 2009.

*Intelligent patching systems carving out a 'large' niche*, Cabling Installation & Maintenance, vol. 12, Issue 7, Jul. 2004 (5 pages).

*intelliMAC: The intelligent way to make Moves, Adds or Changes!* NORDX/CDT © 2003 (6 pages).

iTRACS Physical Layer Manager FAQ, obtained on Jun. 11, 2008 from http://www.itracs.com/products/physical-layer-manager-faqs.html (6 pages).

Meredith, L., "Managers missing point of intelligent patching," *Daa Center News*, Jun. 21, 2005, obtained Dec. 2, 2008 from http://searchdatacenter.techtarget.com/news/article/0,289142,sid80_gci1099991,00.html.

*SYSTIMAX® iPatch System Wins Platinum Network of the Year Award*, Press Release, Jan. 30, 2003, obtained from http://www.avaya.com/usa/about-avaya/newsroom/news-releases/2003/pr-030130a on Jan. 7, 2009.

Ohtsuki, F. et al., "Design of Optical Connectors with ID Modules," *Electronics and Communications in Japan*, Part 1, vol. 77, No. 2, pp. 94-105 (Feb. 1994).

TrueNet; TFP Series Rack Mount Fiber Panels, Spec Sheet; May 2008; 8 pages.

* cited by examiner

MANAGED FIBER CONNECTIVITY SYSTEMS

CROSS REFERENCE TO RELATED APPLICATION

This application claims the benefit of U.S. Provisional Application No. 61/679,485, filed Aug. 3, 2012, and titled "Managed Fiber Connectivity Systems," the disclosure of which is hereby incorporated herein by reference.

BACKGROUND

In communications infrastructure installations, a variety of communications devices can be used for switching, cross-connecting, and interconnecting communications signal transmission paths in a communications network. Some such communications devices are installed in one or more equipment racks to permit organized, high-density installations to be achieved in a limited space.

Communications devices can be organized into communications networks, which typically include numerous logical communication links between various items of equipment. Often a single logical communication link is implemented using several pieces of physical communication media. For example, a logical communication link between a computer and an inter-networking device such as a hub or router can be implemented as follows. A first cable connects the computer to a jack mounted in a wall. A second cable connects the wall-mounted jack to a port of a patch panel, and a third cable connects the inter-networking device to another port of a patch panel. A "patch cord" cross connects the two together. In other words, a single logical communication link is often implemented using several segments of physical communication media.

Network management systems (NMS) are typically aware of logical communication links that exist in a communications network, but typically do not have information about the specific physical layer media (e.g., the communications devices, cables, couplers, etc.) that are used to implement the logical communication links. Indeed, NMS systems typically do not have the ability to display or otherwise provide information about how logical communication links are implemented at the physical layer level.

SUMMARY

The present disclosure relates to optical adapters and optical connectors that provide physical layer management capabilities. In accordance with certain aspects, the disclosure relates to LC-type optical adapters and LC-type optical connectors. In other implementations, the physical layer management capabilities can be applied to other types of optical connectors (e.g., MPO-type connectors, SC-type connectors, LX.5-type connectors, FC-type connectors, ST-type connectors, etc.) and adapters. In still other implementations, the physical layer management capabilities can be applied to electrical connectors (e.g., RJ-45 type connectors) and sockets.

In some implementations, a connectorized media cable includes at least one primary media segment; a first plug connector coupled to a first end of the media segment; and a second plug connector coupled to a second end of the media segment. The first plug connector includes a first storage device having memory configured to store physical layer information pertaining to the cable. The first storage device also includes at least four contacts. At least three of these contacts connect to a memory on the first storage device. The four contacts are isolated from the primary media segment. The second plug connector includes a second storage device having memory configured to store physical layer information pertaining to the cable. The second storage device also includes at least four contacts. At least three of these contacts connect to a memory on the second storage device. The four contacts of each storage device are isolated from the primary media segment. The media cable also includes an electrical conductor extending along the media cable between a fourth one of the contacts of the first plug connector and a fourth one of the contacts of the second plug connector.

In other implementations, a coupler assembly includes a coupler device defining at least one port having a primary communications interface and a media reading interface; and an electrical device mounted to the coupler device. The media reading interface includes four contact members that are each isolated from each other and from the primary communications interface. The electrical device is electrically coupled to one of the four contact members at the port.

In other implementations, a method of detecting a broken cable having plug connectors at opposite ends includes applying a power signal to a first of four contacts of a PLM interface at a first end of the cable; applying a grounding signal to a second of the four contacts of the PLM interface at the first end of the cable; applying a PLM signal to a third of the four contacts of the PLM interface at the first end of the cable; and applying a continuity signal to a fourth of the four contacts of the PLM interface at the first end of the cable.

In other implementations, a method of detecting a broken cable having plug connectors at opposite ends includes receiving a power signal at a first of four contacts of a PLM interface at a second end of the cable; receiving a grounding signal at a second of the four contacts of the PLM interface at the second end of the cable; receiving a PLM signal at a third of the four contacts of the PLM interface at the second end of the cable; determining whether a continuity signal is received at a fourth of the four contacts of the PLM interface at the second end of the cable; and triggering an alarm when the continuity signal is not received.

In other implementations, a method of powering a detector at a coupler device using a cable having first and second ends terminated at plug connectors includes receiving a VDC power signal at a first of four contacts of a storage device at the second end of the cable and directing the VDC power signal to a processor; receiving a grounding signal at a second of the four contacts of the storage device at the second end of the cable and directing the grounding signal to the processor; receiving a PLM signal at a third of the four contacts of the storage device at the second end of the cable and directing the data signal to the processor; receiving a DC power signal at a fourth of the four contacts of the storage device at the second end of the cable; and directing the DC power signal to a sensor or detection device that is electrically coupled to the port of the coupler device. The storage device and the processor are isolated form at least a first media segment extending through the cable.

In other implementations, a method of managing physical layer information within a communications system including at least a coupler device and at least a cable terminated by a plug connector having a storage device includes receiving a power signal at a first of four contacts of the storage device; receiving a grounding signal at a second of the four contacts of the storage device; receiving a first data management signal at a third of the four contacts of the storage device; and receiving a second data management signal at a fourth of the four contacts of the storage device. The first and second data management signals are generated using a two-wire serial communication protocol.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Figure 1:
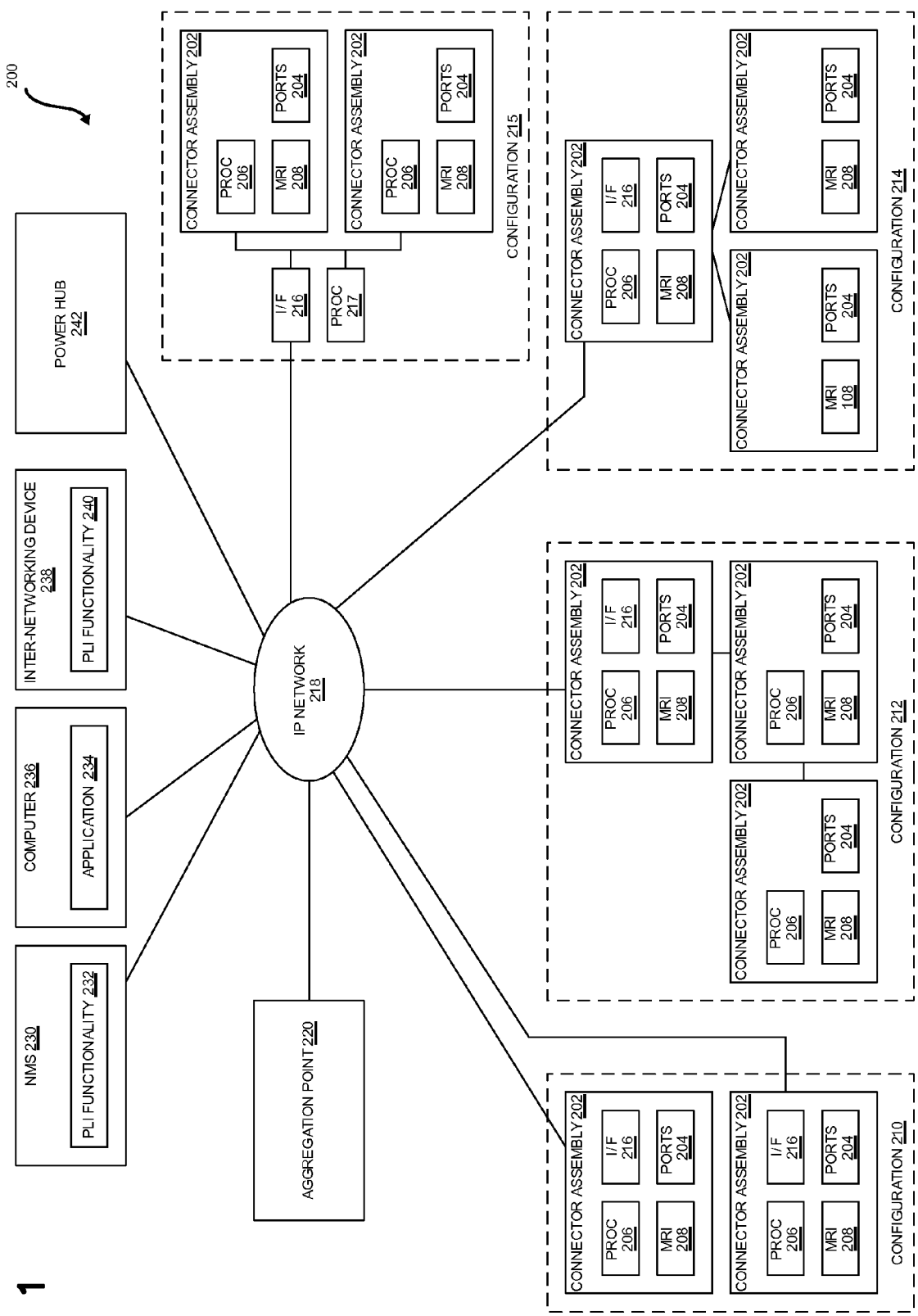
FIG. 1 is a block diagram of one embodiment of a communications management system that includes PLI functionality as well as PLM functionality in accordance with aspects of the present disclosure.

Reference will now be made in detail to exemplary aspects of the present disclosure that are illustrated in the accompanying drawings. Wherever possible, the same reference numbers will be used throughout the drawings to refer to the same or like parts.

Reference will now be made in detail to exemplary aspects of the present disclosure that are illustrated in the accompanying drawings. Wherever possible, the same reference numbers will be used throughout the drawings to refer to the same or like parts.

In accordance with some aspects of the disclosure, an example communications and data management system includes at least part of a communications network along which communications signals pass. Media segments connect equipment of the communications network. Non-limiting examples of media segments include optical cables, electrical cables, and hybrid cables. This disclosure will focus on optical media segments. The media segments may be terminated with optical plug connectors, media converters, or other optical termination components.

In accordance with aspects of the disclosure, the communications and data management system provides physical layer information (PLI) functionality as well as physical layer management (PLM) functionality. As the term is used herein, "PLI functionality" refers to the ability of a physical component or system to identify or otherwise associate physical layer information with some or all of the physical components used to implement the physical layer of the system. As the term is used herein, "PLM functionality" refers to the ability of a component or system to manipulate or to enable others to manipulate the physical components used to implement the physical layer of the system (e.g., to track what is connected to each component, to trace connections that are made using the components, or to provide visual indications to a user at a selected component).

As the term is used herein, "physical layer information" refers to information about the identity, attributes, and/or status of the physical components used to implement the physical layer of the communications system. Physical layer information of the communications system can include media information, device information, and location information. Media information refers to physical layer information pertaining to cables, plugs, connectors, and other such physical media. Non-limiting examples of media information include a part number, a serial number, a plug type, a conductor type, a cable length, cable polarity, a cable pass-through capacity, a date of manufacture, a manufacturing lot number, the color or shape of the plug connector, an insertion count, and testing or performance information. Device information refers to physical layer information pertaining to the communications panels, inter-networking devices, media converters, computers, servers, wall outlets, and other physical communications devices to which the media segments attach. Location information refers to physical layer information pertaining to a physical layout of a building or buildings in which the network is deployed.

In accordance with some aspects, one or more of the components (e.g., media segments, equipment, etc.) of the communications network are configured to store physical layer information pertaining to the component as will be disclosed in more detail herein. Some components include media reading interfaces that are configured to read stored physical layer information from the components. The physical layer information obtained by the media reading interface may be communicated over the network for processing and/or storage.

FIG. 1 is a block diagram of one example implementation of a communications management system 200 that includes PLI functionality as well as PLM functionality. The management system 200 comprises a plurality of connector assemblies 202 (e.g., patch panels, blades, optical adapters, electrical jacks, media converters, transceivers, etc.), connected to an IP network 218. Each connector assembly 202 includes one or more ports 204, each of which is configured to receive a media segment for connection to other media segments or equipment of the management system 200. For the purposes of this disclosure, optical connector assemblies 202 and optical media segments will be described. In other implementations, however, electrical connector assemblies and media segments may be used.

At least some of the connector assemblies 202 are designed for use with optical cables that have physical layer information stored in or on them. The physical layer information is configured to be read by a programmable processor 206 associated with one or more connector assemblies 202. In general, the programmable processor 206 communicates with memory of an optical cable using a media reading interface 208. In some implementations, each of the ports 204 of the connector assemblies 202 includes a respective media reading interface 208. In other implementations, a single media reading interface 208 may correspond to two or more ports 204.

In FIG. 1, four example types of connector assembly configurations 210, 212, 214, and 215 are shown. In the first connector assembly configuration 210, each connector assembly 202 includes its own respective programmable processor 206 and its own respective network interface 216 that is used to communicatively couple that connector assembly 202 to an Internet Protocol (IP) network 218. In the second type of connector assembly configuration 212, connector assemblies 202 are grouped together in proximity to each other (e.g., in a rack, rack system, patch panel, chassis, or equipment closet). Each connector assembly 202 of the group includes its own respective programmable processor 206. However, not all of the connector assemblies 202 include their own respective network interfaces 216.

In the third type of connector assembly configuration 214, some of the connector assemblies 202 (e.g., "masters") in the group include their own programmable processors 206 and network interfaces 216, while others of the connector assemblies 202 (e.g., slaves") do not include their own programmable processors 206 or network interfaces 216. Each programmable processor 206 is able to carry out the PLM functions for both the connector assembly 202 of which it is a part and any of the slave connector assemblies 202 to which the master connector assembly 202 is connected via the local connections.

In the fourth type of connector assembly configuration 215, each of the connector assemblies 202 in a group includes its own "slave" programmable processors 206. Each slave programmable processor 206 is configured to manage the media reading interfaces 208 to determine if physical communication media segments are attached to the port 204 and to read the physical layer information stored in or on the attached physical communication media segments (if the attached segments have such information stored therein or thereon). Each of the slave programmable processors 206 in the group also is communicatively coupled to a common "master" programmable processor 217. The master processor 217 communicates the physical layer information read from by the slave processors 206 to devices that are coupled to the IP network 218. For example, the master programmable processor 217 may be coupled to a network interface 216 that couples the master processor 217 to the IP network 218.

In accordance with some aspects, the communications management system 200 includes functionality that enables the physical layer information captured by the connector assemblies 202 to be used by application-layer functionality outside of the traditional physical-layer management application domain. For example, the management system 200 may include an aggregation point 220 that is communicatively coupled to the connector assemblies 202 via the IP network 218. The aggregation point 220 can be implemented on a standalone network node or can be integrated along with other network functionality.

The aggregation point 220 includes functionality that obtains physical layer information from the connector assemblies 202 (and other devices) and stores the physical layer information in a data store. The aggregation point 220 also can be used to obtain other types of physical layer information. For example, this information can be provided to the aggregation point 220, for example, by manually entering such information into a file (e.g., a spreadsheet) and then uploading the file to the aggregation point 220 (e.g., using a web browser) in connection with the initial installation of each of the various items. Such information can also, for example, be directly entered using a user interface provided by the aggregation point 220 (e.g., using a web browser).

The management system 200 also may include a network management system (NMS) 230 includes PLI functionality 232 that is configured to retrieve physical layer information from the aggregation point 220 and provide it to the other parts of the NMS 230 for use thereby. The NMS 230 uses the retrieved physical layer information to perform one or more network management functions. In certain implementations, the NMS 230 communicates with the aggregation point 220 over the IP network 218. In other implementations, the NMS 230 may be directly connected to the aggregation point 220.

An application 234 executing on a computer 236 also can use the API implemented by the aggregation point 220 to access the PLI information maintained by the aggregation point 220 (e.g., to retrieve such information from the aggregation point 220 and/or to supply such information to the aggregation point 220). The computer 236 is coupled to the IP network 218 and accesses the aggregation point 220 over the IP network 218.

One or more inter-networking devices 238 used to implement the IP network 218 include physical layer information (PLI) functionality 240. The PLI functionality 240 of the inter-networking device 238 is configured to retrieve physical layer information from the aggregation point 220 and use the retrieved physical layer information to perform one or more inter-networking functions. Examples of inter-networking functions include Layer 1, Layer 2, and Layer 3 (of the OSI model) inter-networking functions such as the routing, switching, repeating, bridging, and grooming of communication traffic that is received at the inter-networking device.

Additional details pertaining to example communications management system 200 can be found in U.S. application Ser. No. 13/025,841, filed Feb. 11, 2011, and titled "Managed Fiber Connectivity Systems," the disclosure of which is hereby incorporated herein by reference.

Figure 2:
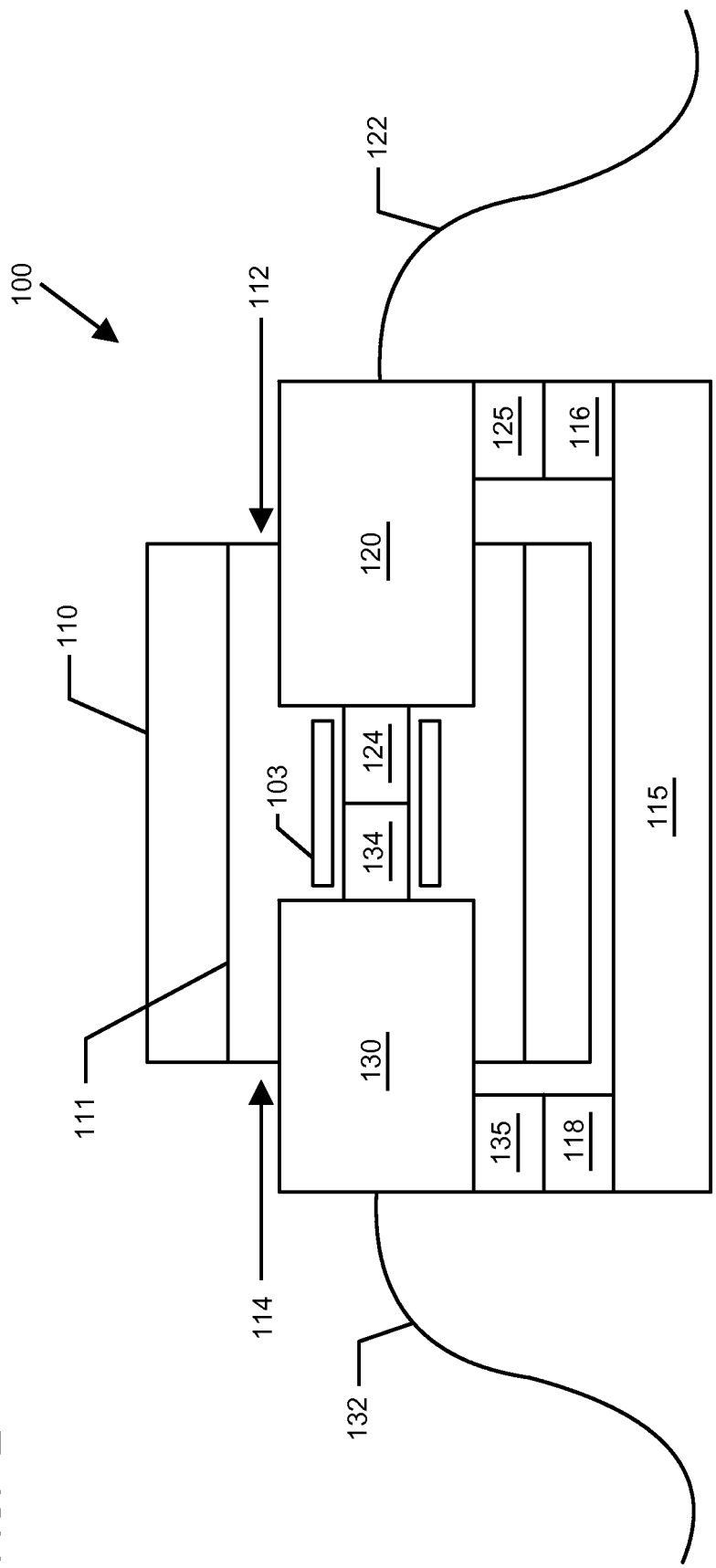
FIG. 2 is a block diagram of one high-level example of a coupler assembly and media reading interface that are suitable for use in the management system of FIG. 1 in accordance with aspects of the present disclosure.

FIG. 2 is a schematic diagram of one example connector assembly 110 configured to collect physical layer information from a connector arrangement 120 terminating a media segment 122. The example connector assembly 120 of FIG. 2 is configured to connect segments of optical physical communications media in a physical layer management system. The connector assembly 110 includes a fiber optic adapter defining at least one connection opening 111 having a first port end 112 and a second port end 114. A sleeve (e.g., a split sleeve) 103 is arranged within the connection opening 111 of the adapter 110 between the first and second port ends 112, 114. Each port end 112, 114 is configured to receive a connector arrangement as will be described in more detail herein.

A first example segment of optical physical communication media includes a first optical fiber 122 terminated by a first connector arrangement 120. A second example segment of optical physical communication media includes a second optical fiber 132 terminated by a second connector arrangement 130. The first connector arrangement 120 is plugged into the first port end 112 and the second connector arrangement 130 is plugged into the second port end 114. Each fiber connector arrangement 120, 130 includes a ferrule 124, 134 through which optical signals from the optical fiber 122, 132, respectively, pass.

The ferrules 124, 134 of the connector arrangements 120, 130 are aligned by the sleeve 103 when the connector arrangements 120, 130 are inserted into the connection opening 111 of the adapter 110. Aligning the ferrules 124, 134 provides optical coupling between the optical fibers 122, 132. In some implementations, each segment of optical physical communication media (e.g., each optical fiber 122, 132) carries communication signals. The aligned ferrules 124, 134 of the connector arrangements 120, 130 create an optical path along which the communication signals may be carried.

In some implementations, the first connector arrangement 120 may include a storage device 125 that is configured to store physical layer information (e.g., an identifier and/or attribute information) pertaining to the segment of physical communications media (e.g., the first connector arrangement 120 and/or the fiber optic cable 122 terminated thereby). In some implementations, the connector arrangement 130 also includes a storage device 135 that is configured to store information (e.g., an identifier and/or attribute information) pertaining to the second connector arrangement 130 and/or the second optic cable 132 terminated thereby.

In one implementation, each of the storage devices 125, 135 is implemented using an EEPROM (e.g., a PCB surface-mount EEPROM). In other implementations, the storage devices 125, 135 are implemented using other non-volatile memory device. Each storage device 125, 135 is arranged and configured so that it does not interfere or interact with the communications signals communicated over the media segments 122, 132.

In accordance with some aspects, the adapter 110 is coupled to at least a first media reading interface 116. In certain implementations, the adapter 110 also is coupled to at least a second media interface 118. In some implementations, the adapter 110 is coupled to multiple media reading interfaces. In certain implementations, the adapter 110 includes a media reading interface for each port end defined by the adapter 110. In other implementations, the adapter 110 includes a media reading interface for each connection opening 111 defined by the adapter 110. In still other implementations, the adapter 110 includes a media reading interface for each connector arrangement that the adapter 110 is configured to receive. In still other implementations, the adapter 110 includes a media reading interface for only a portion of the connector arrangement that the adapter 110 is configured to receive.

In some implementations, at least the first media reading interface 116 is mounted to a printed circuit board 115. In the example shown, the first media reading interface 116 of the printed circuit board 115 is associated with the first port end 112 of the adapter 110. In some implementations, the printed circuit board 115 also can include the second media reading interface 118. In one such implementation, the second media reading interface 1818 is associated with the second port end 114 of the adapter 110.

The printed circuit board 115 of the connector assembly 110 can be communicatively connected to one or more programmable processors (e.g., processors 216 of FIG. 1) and/or to one or more network interfaces (e.g., network interfaces 216 of FIG. 1). The network interface may be configured to send the physical layer information to a physical layer management network (e.g., see IP network 218 of FIG. 1). In one implementation, one or more such processors and interfaces can be arranged as components on the printed circuit board 115. In another implementation, one or more such processor and interfaces can be arranged on separate circuit boards that are coupled together. For example, the printed circuit board 115 can couple to other circuit boards via a card edge type connection, a connector-to-connector type connection, a cable connection, etc.

When the first connector arrangement 120 is received in the first port end 112 of the adapter 110, the first media reading interface 1816 is configured to enable reading (e.g., by the processor) of the information stored in the storage device 125. The information read from the first connector arrangement 120 can be transferred through the printed circuit board 115 to a physical layer management network, e.g., network 218 of FIG. 1, etc. When the second connector arrangement 130 is received in the second port end 114 of the adapter 110, the second media reading interface 118 is configured to enable reading (e.g., by the processor) of the information stored in the storage device 135. The information read from the second connector arrangement 130 can be transferred through the printed circuit board 115 or another circuit board to the physical layer management network.

In some such implementations, the storage devices 125, 135 and the media reading interfaces 116, 118 each comprise three (3) leads—a power lead, a ground lead, and a data lead. The three leads of the storage devices 125, 135 come into electrical contact with three (3) corresponding leads of the media reading interfaces 116, 118 when the corresponding media segment is inserted in the corresponding port. In certain example implementations, a two-line interface is used with a simple charge pump. In still other implementations, additional leads can be provided (e.g., for potential future applications). Accordingly, the storage devices 125, 135 and the media reading interfaces 116, 118 may each include four (4) leads, five (5) leads, six (6) leads, etc.

FIGS. 3-7 illustrate an example implementation of a connector system that can be utilized on a connector assembly (e.g., a communications panel) having PLI functionality as well as PLM functionality. One example connector assembly on which the connector system can be implemented is a bladed chassis. The connector system includes at least one example communications coupler assembly 4200 and at least two connector arrangements 4100.

The communications coupler assembly 4200 is configured to be mounted to a connector assembly, such as a communications blade or a communications panel. One or more connector arrangements 4100, which terminate segments 4010 of communications media, are configured to communicatively couple to other segments of physical communications media at the coupler assembly 4200. Accordingly, communications data signals carried by a media segment 4010 terminated by a first connector arrangement 4100 can be propagated to another media segment 4010 (e.g., terminated by a second connector arrangement 4100) through the communications coupler assembly 4200.

Figure 3:
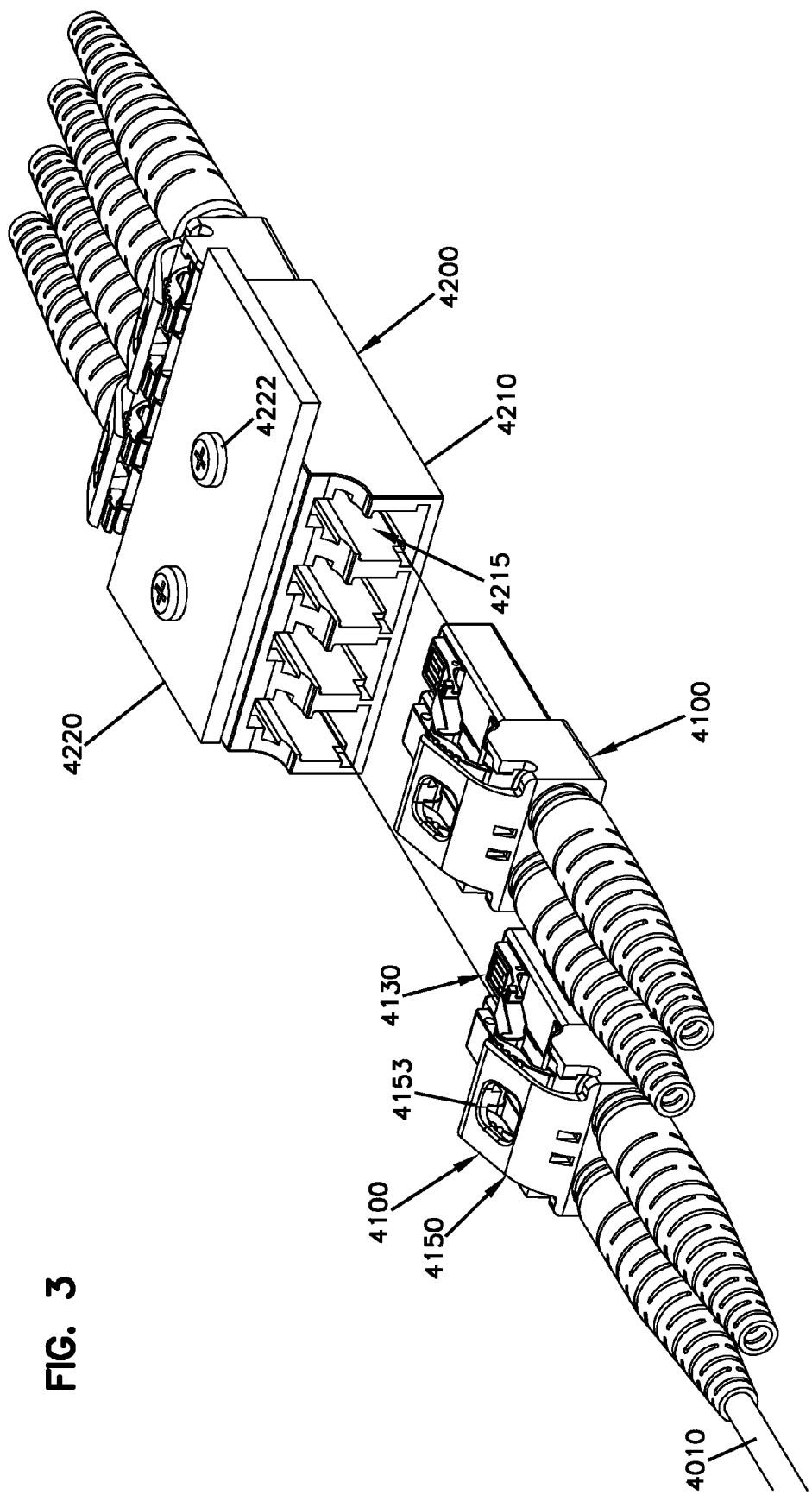
FIG. 3 illustrates connector system including an example communications coupler assembly, which includes a coupler device and a circuit board, and at least two connector arrangements that each include a storage device.
Figure 4:
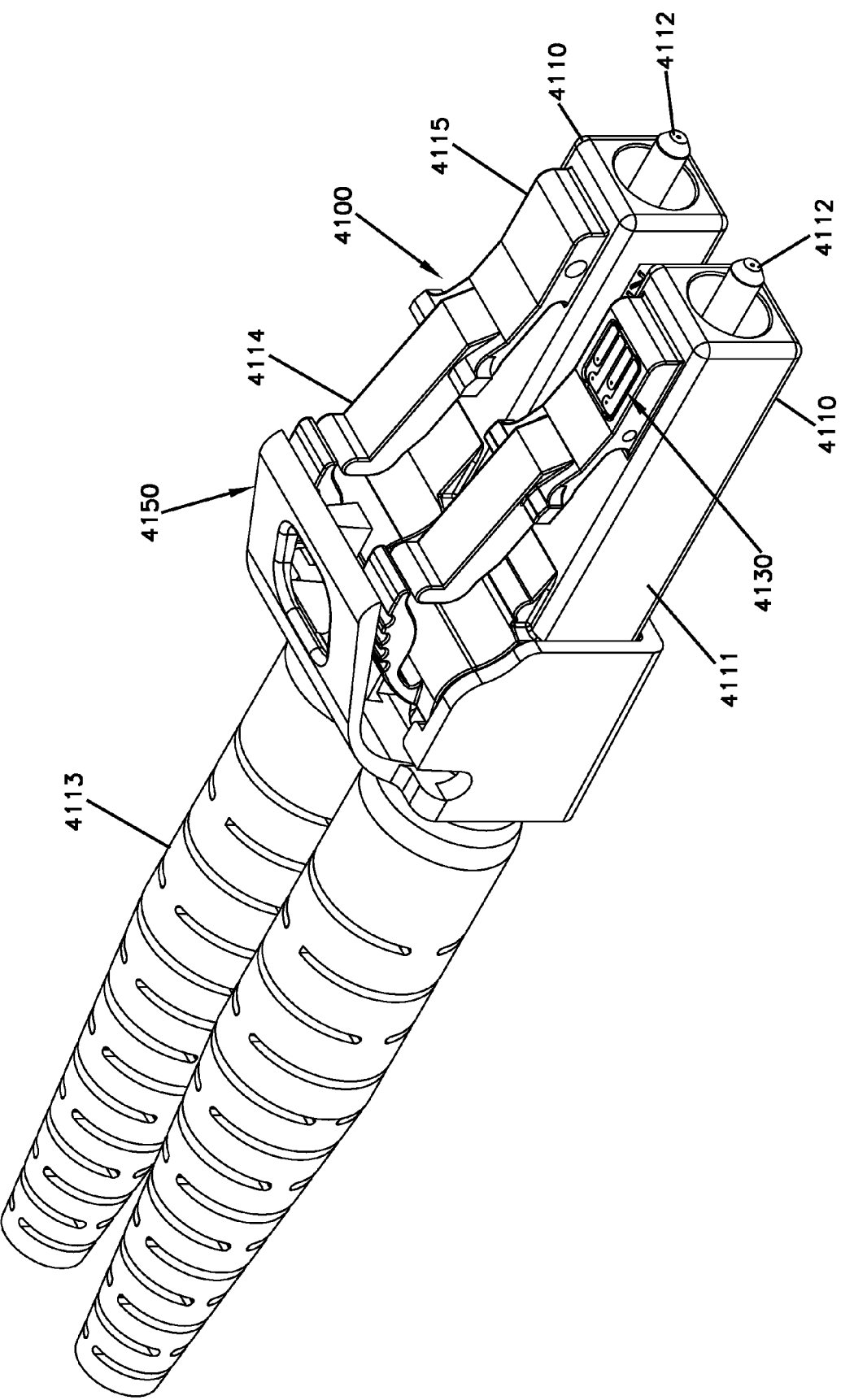
FIG. 4 is a perspective view of one of the connector arrangements of FIG. 3.

An example implementation of a connector arrangement 4100 is shown in FIG. 4. The connector arrangement 4100 includes one or more fiber optic connectors 4110, each of which terminates one or more optical fibers 4010 (FIG. 3). In the example shown in FIGS. 3 and 4, each connector arrangement 4100 defines a duplex fiber optic connector arrangement including two fiber optic connectors 4110 held together using a clip 4150. In another example implementation, a connector arrangement 4100 can define a simplex fiber optic connector 4110.

As shown in FIG. 4, each fiber optic connector 4110 includes a connector body 4111 protecting a ferrule 4112 that retains an optical fiber 4010. The connector body 4111 is secured to a boot 4113 for providing bend protection to the optical fiber 4010. In the example shown, the connector 4110 is an LC-type fiber optic connector. The connector body 4111 includes a fastening member (e.g., latch arm) 4114 that facilitates retaining the fiber optic connector 4110 within a passage 4215 in the communications coupler assembly 4200.

The connector arrangement 4100 can be configured to store physical layer information. For example, a storage device 4130 may be installed on or in the body 4111 of one or more of the fiber optic connectors 4110 of each connector arrangement 4100. In the example shown in FIG. 4, the storage device 4130 is installed on only one fiber optic connector 4110 of a duplex connector arrangement 4100. In other implementations, however, a storage device 4130 may be installed on each fiber optic connector 4110 of a connector arrangement 4100.

Figure 5:
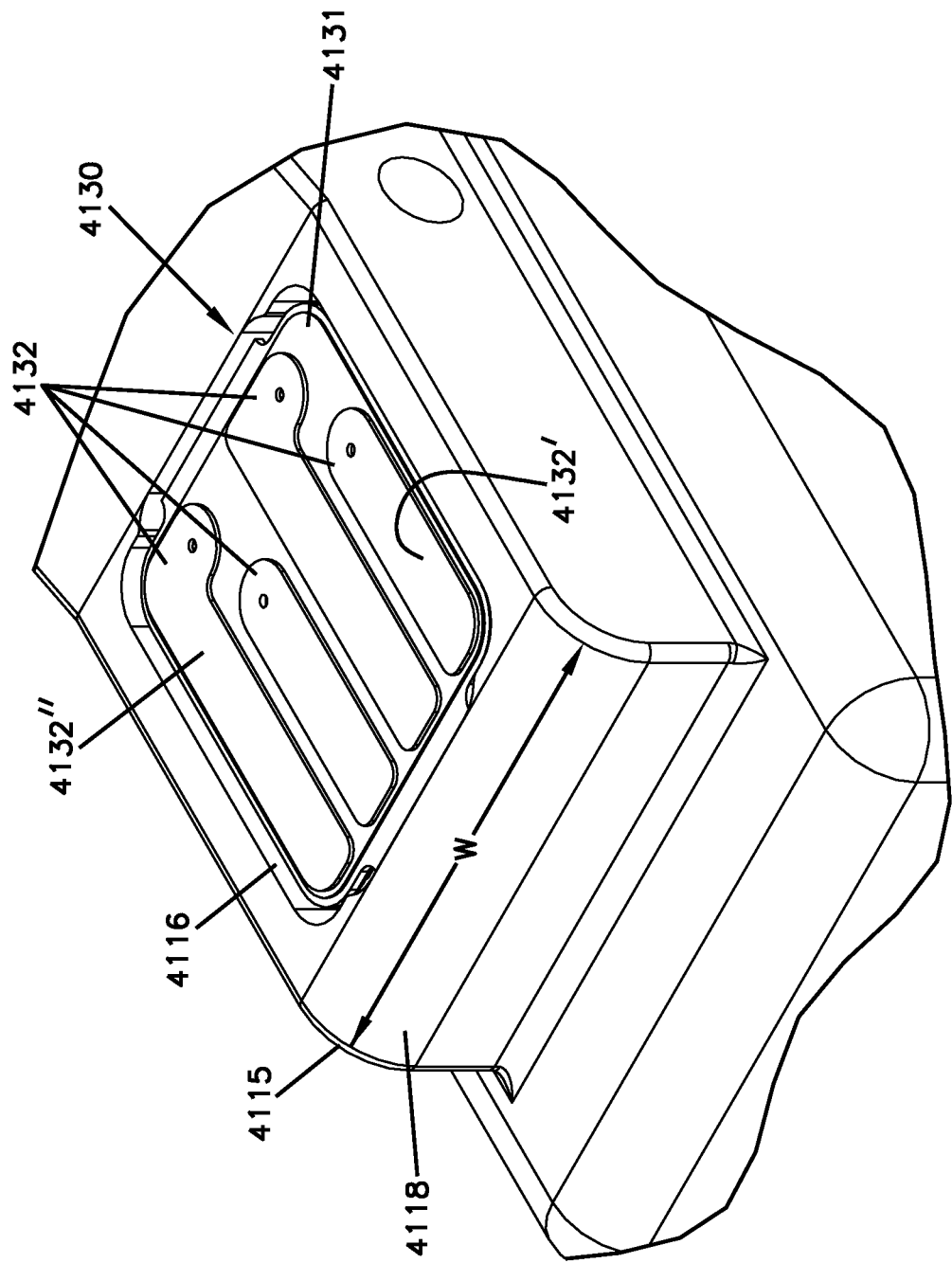
FIG. 5 is an enlarged view of the storage device of FIG. 4.

FIG. 5 shows one example storage device 4130 that includes a printed circuit board 4131 on which memory circuitry can be arranged. Electrical contacts 4132 also may be arranged on the printed circuit board 4131 for interaction with a media reading interface of the communications coupler assembly 4200 (described in more detail herein). In one example implementation, the storage device 4130 includes an EEPROM circuit arranged on the printed circuit board 4131. In one example implementation, an EEPROM circuit is arranged on the non-visible side of the circuit board 4131 in FIG. 5 (e.g., in a cavity 4116 defined in a key area 4115 of the connector 4110). In other implementations, however, the storage device 4130 can include any suitable type of non-volatile memory.

In the example shown in FIG. 5, the storage device 4130 includes four contact members 4132. In some implementations, the contacts 4132 have different lengths. In certain implementations, the contacts 4132 have different shapes. For example, in some implementation, the contacts 4132 include one or more contact members 4132' that have generally rounded ends at one or both ends of the contact members 4132'. In certain implementations, the contacts 4132 also include one or more contact members 4132" that are generally L-shaped. In the example shown, the L-shaped contacts 4132" are longer than the rounded end contacts 4132'. In other implementations, however, the contacts 4132 may have the same length or may each have different lengths.

Figure 6:
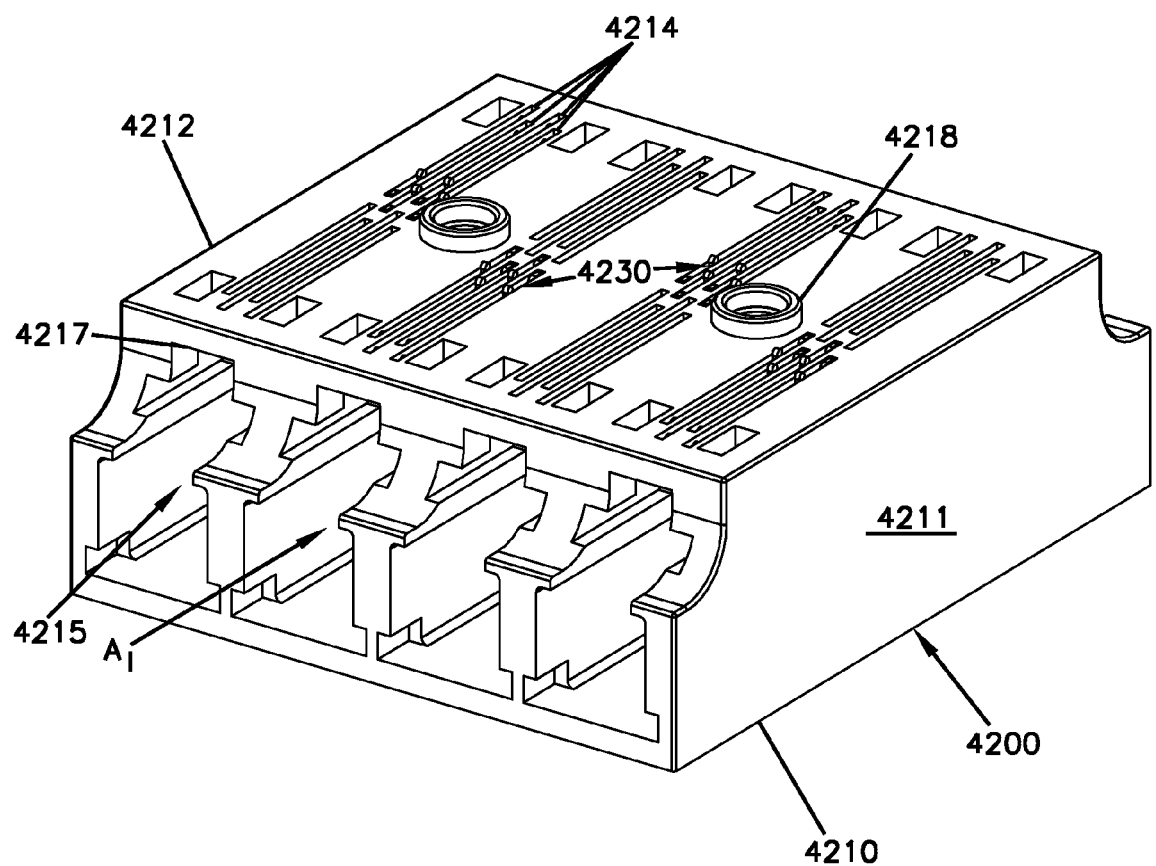
FIG. 6 is perspective view of a coupler device of FIG. 3 with the circuit board removed so that a slotted surface is visible.
Figure 7:
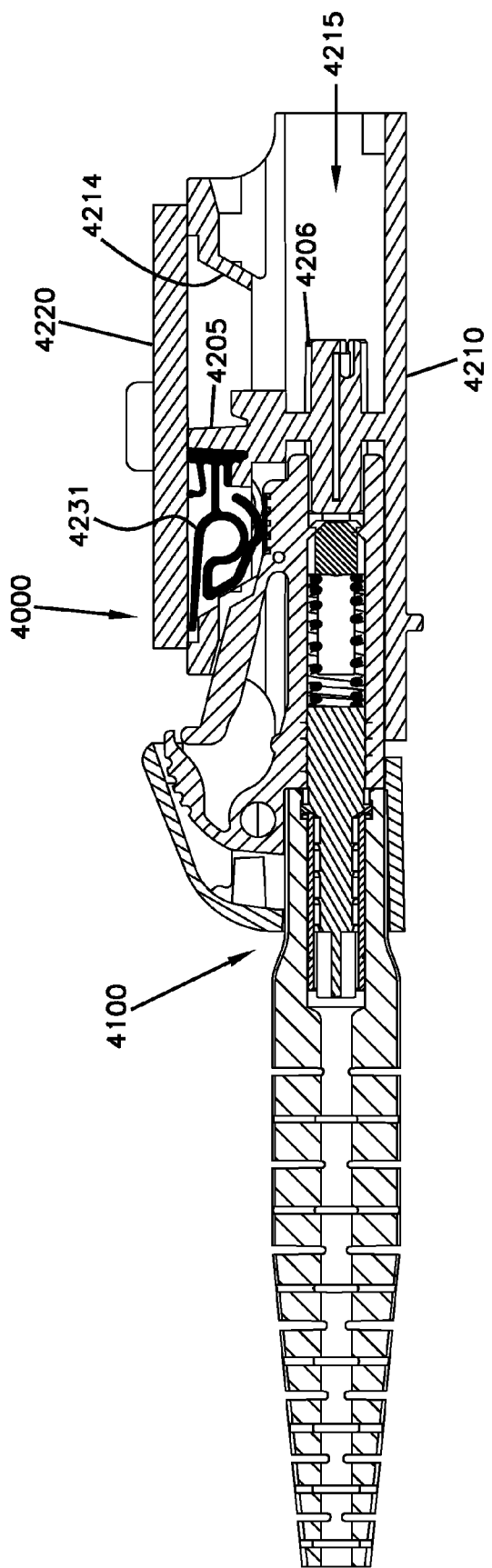
FIG. 7 is a cross-section view of the coupler assembly of FIG. 3 with a connector plugged into one of the ports so that an interaction between a port contact member and a plug storage contact is visible.

FIGS. 6 and 7 show one example implementation of a communications coupler assembly 4200 implemented as a fiber optic adapter. The example communications coupler assembly 4200 includes an adapter housing 4210 defining one or more passages 4215 configured to align and interface two or more fiber optic connectors 4110 (e.g., see FIG. 3). In other example implementations, however, one or more passages 4215 can be configured to communicatively couple together a fiber optic connector 4110 with a media converter (not shown) to convert the optical data signals into electrical data signals, wireless data signals, or other such data signals. In other implementations, however, the communications coupler assembly 4200 can include an electrical termination block that is configured to receive punch-down wires, electrical plugs (e.g., for electrical jacks), or other types of electrical connectors.

As shown in FIG. 3, a printed circuit board 4220 is configured to secure (e.g., via fasteners 4222) to the adapter housing 4210. Non-limiting examples of suitable fasteners 4222 include screws, snaps, and rivets. For ease in understanding, only a portion of the printed circuit board 4220 is shown in FIG. 3. It is to be understood that the printed circuit board 4220 electrically connects to a data processor and/or to a network interface (e.g., the processor 217 and network interface 216 of FIG. 1). It is further to be understood that multiple communications coupler housings 4210 can be connected to the printed circuit board 4220 within a connector assembly (e.g., a communications panel).

The fiber optic adapter 4210 includes one or more media reading interfaces 4230, each configured to acquire the physical layer information from the storage device 4130 of a fiber optic connector 4110 plugged into the fiber optic adapter 4210. For example, in one implementation, the adapter 4210 can include a media reading interface 4230 associated with each passage 4215. In another implementation, the adapter 4210 can include a media reading interface 4230 associated with each connection end of each passage 4215. In still other implementations, the adapter 4210 can include a media reading interface 4230 associated with each of a set of passages 4215 that accommodate a connector arrangement 4100.

In general, each media reading interface 4230 is formed from one or more contact members 4231 (see FIG. 7). In certain implementations, a top surface of the coupler housing 4210 defines slots 4214 (FIG. 6) configured to receive one or more contact members 4231. In other implementations, contact members 4231 can be soldered to a printed circuit board attached to the coupler housing 4210. When a connector 4110 with a storage device 4130 is inserted into one of the passages 4215 of the coupler housing 4210, the contact pads 4132 of the storage device 4130 are configured to align with the contact members 4231 (see FIG. 7).

The contact members 4231 extend between an external surface of the adapter housing 4210 and the passages 4215. Portions of each contact member 4231 engage contacts and tracings on the printed circuit board 4220 mounted to the slotted surface of the adapter housing 4210. Other portions of the contact members 4231 engage the electrical contacts 4132 of the storage members 4130 attached to any connector arrangements 4100 positioned in the passages 4215 (see FIG. 7). A processor coupled to the circuit board 4220 can access the memory 4133 of each connector arrangement 4100 through corresponding ones of the contact members 4231, 4131.

In some implementations, the media reading interface 4230 includes multiple contact members 4231. For example, in certain implementations, the media reading interface 4230 includes at least a first contact member 4231 that transfers power, at least a second contact member 4231 that transfers data (e.g., via Serial Clock, Data Input/Output), and at least a third contact member 4231 that provides grounding. In certain implementation, the media reading interface 4230 includes a fourth contact member 4231. In other implementations, the media reading interface 4230 include greater or fewer contact members 4231.

In accordance with some aspects of the disclosure, the fourth contact member 4231 of the media reading interface 4230 and the fourth contact member 4132 of the connector storage device 4130 support a continuity measurement that allows the data management system (e.g., system 200 of FIG. 1) to detect a cut or broken cable 4010. The continuity measurement will determine if a plug connector 4110 at a first end of a cable 4010 is disconnected from a plug connector 4110 at an opposite end of the cable 4010. Detecting a cut or broken cable can enhance network security and reduce accidental downtime caused by moves, adds, and changes of the cables connections.

In accordance with certain aspects, the continuity measurement can be used to trigger a local external alarm (e.g., an audible alarm, a visual alarm, an email or text alert, etc.). For example, the alarm may be triggered when the continuity measurement is determined to have a particular value (e.g., false) as will be discussed in more detail herein. Triggering the alarm directly bypasses the normal PLM data flow through the data management system, thus eliminating delays inherent in software layered administration systems.

Figure 8:
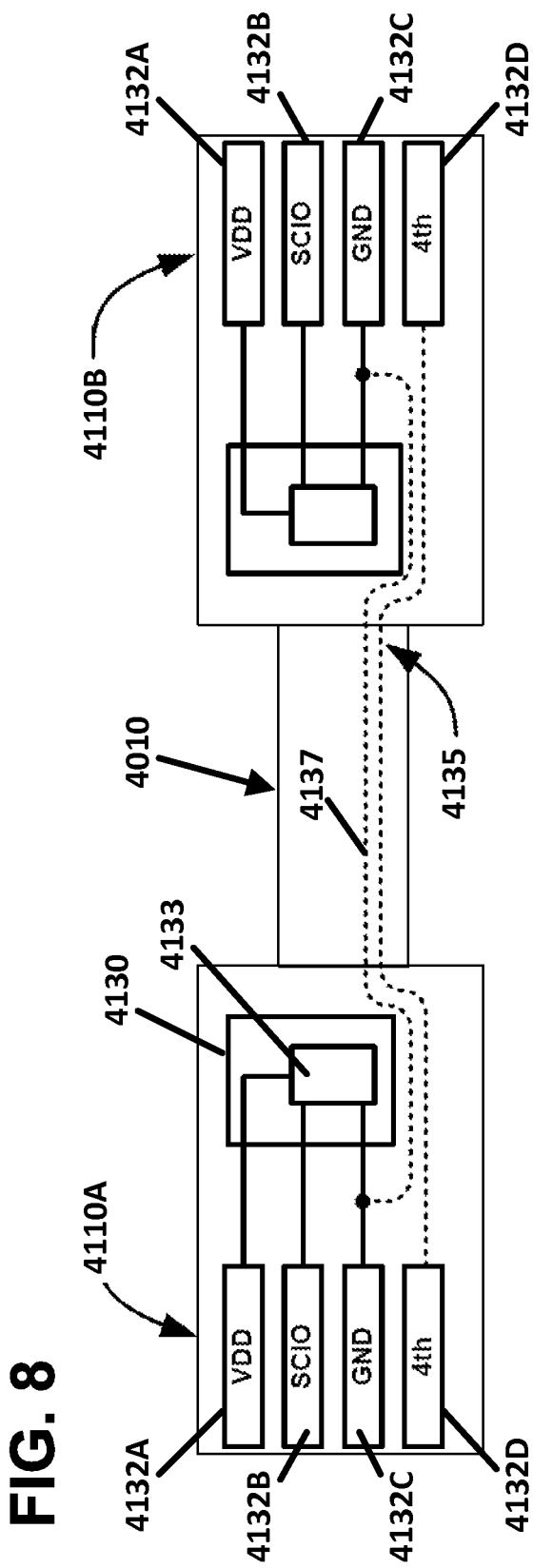
FIG. 8 is a schematic block diagram of an example cable (e.g., optical fiber cable, electrical cable, etc.) that is terminated at opposite ends by connectors, which each have storage devices having four contacts that may be used for any of a variety of applications.

For example, FIG. 8 illustrates a media cable 4010 including a first connector 4110A at a first end and a second connector 4110B at a second end of the cable 4010. Each of the connectors 4110A, 4110B includes a storage device 4130 having a memory 4133 to which electrical contacts 4132 are electrically coupled. A first of the contacts 4132A is configured to carry power, a second of the contacts 4132B is configured to carry data, a third of the contacts is configured to provide grounding. A fourth contact 4132D is associated with the continuity signal.

In some implementations, an electrical conductor (e.g., a wire) 4135 extends through the cable 4010 from the first connector 4110A to the second connector 4110B. The conductor 4135 is electrically coupled to the fourth contact 4132D of the first connector 4110A and to the fourth contact 4132D of the second connector 4110B. A grounding wire 4137 also may extend between the ground contact 4132C of the two connectors 4110A, 4110B.

An electrical signal may be transferred continuously or periodically over the conductor 4135. The port contact 4231 would determine whether the signal is received at the fourth contact member 4132D of the storage device 4130. If the cable 4010 were cut, the signal would not be carried to the fourth contact 4132D at one end of the cable 4010. The lack of signal at the fourth port contact member 4231 would constitute a false continuity reading, which may trigger an alarm as described above. Of course, cables 4010 configured for such applications can be used with coupler devices 4210 that do not support continuity readings since the fourth contacts 4132D are isolated from the other contacts 4132A-4132C and from the communications data signals carried over the media cable 4010. Accordingly, cables 4010 with continuity measurement capabilities would be backward compatible with coupler devices 4210 that do not have such capabilities.

In accordance with other aspects of the disclosure, the fourth contact member 4231 of the media reading interface 4230 and the fourth contact member 4132D of the connector storage device 4130 provide power (e.g., DC power) to a device at the coupler ports 4215 or coupler device 4120. Non-limiting examples of devices that can be powered by the fourth contact 4132D include temperature sensors, motion detectors, light sensors, and IP cameras. This power delivery capability allows the sensors and/or detection devices to be placed anywhere a port 4215 exists. To support such an application, an electrical conductor configured to carry DC power would need to extend through the cable 4010 between the fourth contact 4132D of the first connector 4110A and to the fourth contact 4132D of the second connector 4110B. The power signal carried by the fourth contacts 4132D, 4231 would be isolated from the power signal carried by the first contacts 4132A, 4231.

In accordance with other aspects of the disclosure, the fourth contact member 4231 of the media reading interface 4230 and the fourth contact member 4132D of the connector storage device 4130 can be used to provide fused and current limited +5VDC, similar to the power supplied by a current limited USB port. The power signal carried by the fourth contacts 4132D, 4231 would be isolated from the power signal carried by the first contacts 4132A, 4231.

In accordance with other aspects of the disclosure, the fourth contact member 4231 of the media reading interface 4230 and the fourth contact member 4132D of the connector storage device 4130 can be used to support other types of two-wire serial communication protocols, such as Universal Serial Asynchronous Transmitter-Receiver (USART) or Inter-Integrated Circuit ($I^2C$). Such communications protocols might be advantageous if the plug storage device 4130 included a microcontroller, Digital Signal Processor (DSP), or proprietary Application Specific Integrated Circuit (ASIC) instead of the EEPROM 4133.

Figure 9:
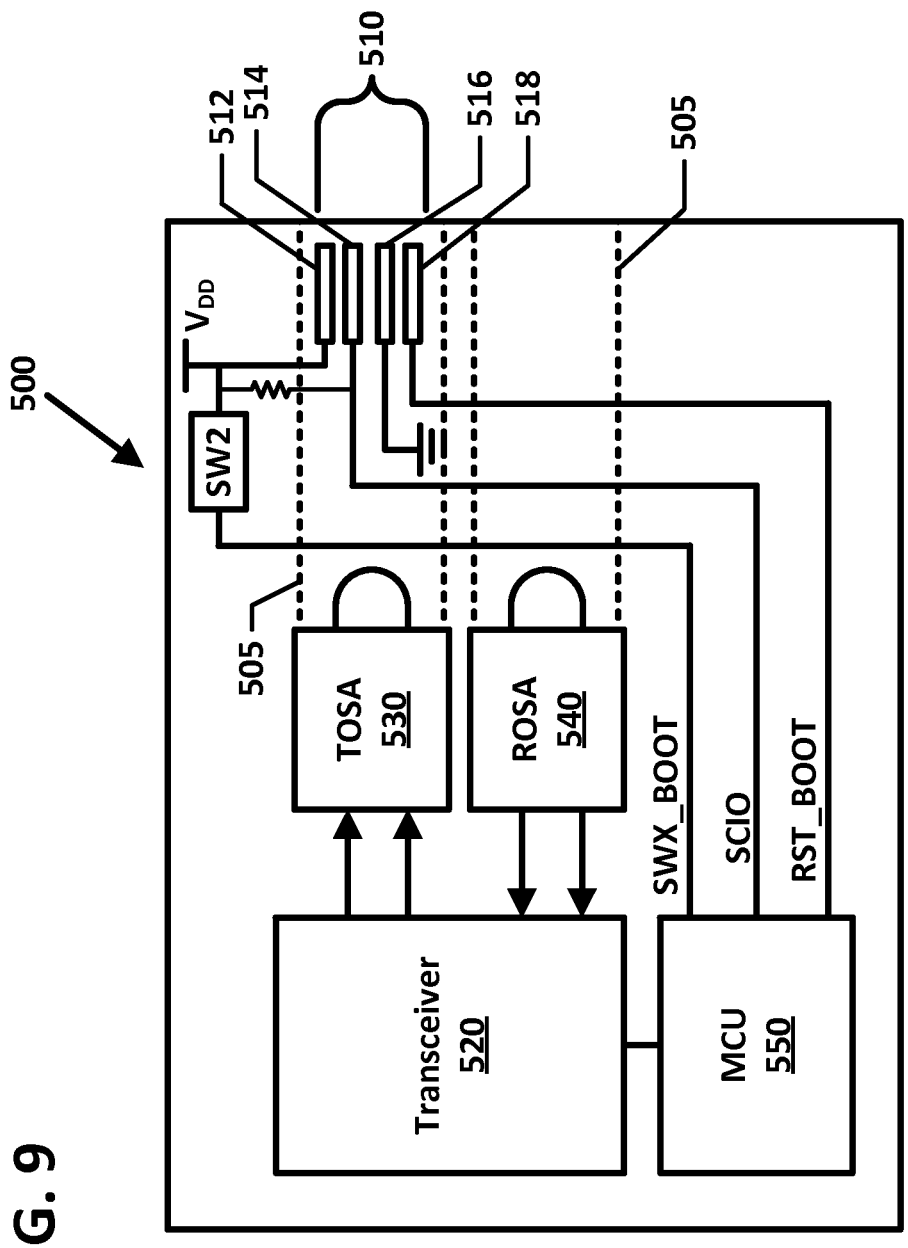
FIG. 9 is a schematic diagram of an example Small Form-factor Pluggable module.

For example, FIG. 9 is a schematic diagram of an example Small Form-factor Pluggable (SFP/SFP+) module 500 defining at least two ports 505. The SFP/SFP+ module 500 includes a transceiver circuit 520 and a controller (e.g., a microcontroller) 550. The transceiver circuit 520 controls a Transmitter Optical Subassembly (TOSA) and a Receiver Optical Subassembly (ROSA) that align with connector plug ferrules received at the ports 505. The controller 550 is manages the transceiver circuit 520.

The SFP/SFP+ module 500 includes at least one media reading interface 510 at one of the ports 505. In some implementations, connector plugs received at the ports 505 form a duplex plug having a single storage device 4130. The media reading interface 510 aligns with the storage device 4130 when the duplex plug is received at the ports 505. In other implementations, each port 505 of the SFP/SFP+ module 500 includes a media reading interface 510.

In the example shown, a first contact member 512 is coupled to power $V_{DD}$, a second contact member 514 is coupled to the controller 550 via a Serial Channel Input-Output (SCIO) line, a third contact member 516 is connected to ground, and a fourth contact member 518 is coupled to the controller 550 via an RST_BOOT line. A switch (e.g., a tristate switch) SW2 is connected to the controller 550 via a SWX_BOOT line, to power, and to the SCIO line via a pull-up resistor. This configuration enables firmware to be updated without removing the SFP/SFP+ module 500 from the host switch or router.

The SWX_BOOT line is used to switch power $V_{DD}$ OFF and ON to the SCIO line (via a pull-up resistor) by controlling the switch SW2. The RST_BOOT line is a connection between the fourth contact member 518 and a General Purpose Input-Output (GPIO) line of the controller 550. After reset or power up, the controller 550 enters a boot loader mode during which updates can be communicated to the controller 550. In this mode, the SCIO line is operating as a transmit line of a USART port and the RST_BOOT line is operating as a receive line of a USART port.

When the boot load timer has expired, the line functions change. For example, the SCIO line is used to detect the presence of a plug and/or to provide a serial communication channel with the plug storage device 4130. The RST_BOOT line is used as an external reset line. The reset line enables the controller 550 to be externally reset, thereby forcing it to re-enter the boot loader mode.

In use, updates can be provided to the SFP/SFP+ module 500 using a peripheral device (e.g., a laptop, a smartphone, a tablet, etc.). The peripheral device is coupled to and drives a boot load adapter, which can be plugged into one or more of the ports 505 of the module 500. The peripheral device will invoke a controller reset via the adapter, thereby causing the controller 550 to re-enter the boot loader mode. During the boot loader mode, the peripheral device establishes a connection (e.g., a USART link) to the controller 550. The SWX_BOOT line operates the switch SW2 to turns OFF power on the USART transmit line. When the boot load is complete, the controller 550 is reset again. When the boot load timer has expired, the controller 550 remaps the USART transmit line to a SCIO line and the USART receive line to the external reset line (RST_BOOT line).

In accordance with other aspects of the disclosure, the fourth contact member 4231 of the media reading interface 4230 and the fourth contact member 4132D of the connector storage device 4130 can be used to actuate and/or control one or more external devices (e.g., devices that operate separately from the data management system). For example, the fourth contacts 4231, 4132D could actuate a cabinet LED, a local audible alarm, etc. In certain implementations, the processor coupled to the circuit board 4220 would direct control of the external devices using the fourth contacts 4132D, 4231.

The above specification, examples and data provide a complete description of the manufacture and use of the composition of the invention. Since many implementations can be made without departing from the spirit and scope of the invention, the invention resides in the claims hereinafter appended.

The invention claimed is:

1. A method of detecting a broken cable that includes plug connectors at opposite ends, each plug connector including a communications interface for communication signals and a separate PLM interface for PLM signals, the PLM interface including four contacts, the method comprising:
    applying a power signal to a first of the four contacts of the PLM interface at a first end of the cable;
    applying a grounding signal to a second of the four contacts of the PLM interface at the first end of the cable;
    applying a PLM signal to a third of the four contacts of the PLM interface at the first end of the cable; and
    applying a continuity signal to a fourth of the four contacts of the PLM interface at the first end of the cable, the fourth contact being isolated from the third contact.

2. The method of claim 1, wherein the communications interface includes an optical interface.

3. The method of claim 1, wherein the communications interface includes an electrical interface.

4. A method of detecting a broken cable that includes plug connectors at opposite ends, each plug connector including a communications interface for communication signals and a separate PLM interface for PLM signals, the PLM interface including four contacts, the method comprising:
    receiving a power signal at a first of the four contacts of the PLM interface at a second end of the cable;
    receiving a grounding signal at a second of the four contacts of the PLM interface at the second end of the cable;
    receiving a PLM signal at a third of the four contacts of the PLM interface at the second end of the cable;
    determining whether a continuity signal is received at a fourth of the four contacts of the PLM interface at the second end of the cable; and
    triggering an alarm when the continuity signal is not received.

5. The method of claim 4, wherein the communications interface includes an optical interface.

6. The method of claim 4, wherein the communications interface includes an electrical interface.

7. The method of claim 2, wherein the optical interface includes an LC-type plug connector.

8. The method of claim 2, wherein the optical interface includes an MPO-type plug connector.

9. The method of claim 2, wherein the optical interface includes an LX.5-type plug connector.

10. The method of claim 2, wherein the optical interface includes an SC-type plug connector.

11. The method of claim 3, wherein the electrical interface includes an RJ-45 connector.

12. The method of claim 1, further comprising receiving a second data management signal at a fourth of the four contacts of the storage device, wherein the first and second data management signals are generated using a two-wire serial communication protocol.

13. The method of claim 5, wherein the optical interface includes an LC-type plug connector.

14. The method of claim 5, wherein the optical interface includes an MPO-type plug connector.

15. The method of claim 5, wherein the optical interface includes an LX.5-type plug connector.

16. The method of claim 5, wherein the optical interface includes an SC-type plug connector.

17. The method of claim 6, wherein the electrical interface includes an RJ-45 connector.

18. The method of claim 4, further comprising receiving a second data management signal at a fourth of the four contacts of the storage device, wherein the first and second data management signals are generated using a two-wire serial communication protocol.

* * * * *